(12) United States Patent
Kanno et al.

(10) Patent No.: US 10,685,981 B2
(45) Date of Patent: Jun. 16, 2020

(54) SEMICONDUCTOR MEMORY DEVICE

(71) Applicant: Toshiba Memory Corporation, Minato-ku (JP)

(72) Inventors: Hiroshi Kanno, Yokkaichi (JP); Tomofumi Zushi, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/282,095

(22) Filed: Feb. 21, 2019

(65) Prior Publication Data

US 2020/0083247 A1 Mar. 12, 2020

(30) Foreign Application Priority Data

Sep. 10, 2018 (JP) ................................. 2018-168624

(51) Int. Cl.
| | |
|---|---|
| *H01L 29/76* | (2006.01) |
| *H01L 27/11582* | (2017.01) |
| *H01L 27/11556* | (2017.01) |
| *H01L 21/311* | (2006.01) |

(52) U.S. Cl.
CPC .. *H01L 27/11582* (2013.01); *H01L 27/11556* (2013.01); *H01L 21/31116* (2013.01)

(58) Field of Classification Search
CPC combination set(s) only.
See application file for complete search history.

(56) References Cited

U.S. PATENT DOCUMENTS

| | | | |
|---|---|---|---|
| 9,520,407 | B2 | 12/2016 | Fukuzumi et al. |
| 2014/0070302 | A1 | 3/2014 | Yoo et al. |

FOREIGN PATENT DOCUMENTS

JP 2018-142654 9/2018

*Primary Examiner* — Robert G Bachner
(74) *Attorney, Agent, or Firm* — Oblon, McClelland, Maier & Neustadt, L.L.P.

(57) ABSTRACT

A semiconductor memory device according to an embodiment includes a base portion, a laminated body, a second conductive layer, and a columnar body. The columnar body includes a semiconductor body and a charge storage film. The semiconductor body includes a first region and a second region. The first region extends from a connection portion between the semiconductor body and the first semiconductor portion to the inside of the second conductive layer. The first region includes a first material. The second region is positioned closer to the laminated body than the first region is and is configured such that at least a portion is present within the second conductive layer. The second region does not include the first material or has a concentration of the first material which is lower than that in the first region. A first outer circumferential length of the semiconductor body within the second conductive layer is larger than a second outer circumferential length of the semiconductor body on a first surface which is an interface between the second conductive layer and the laminated body.

20 Claims, 14 Drawing Sheets

SEMICONDUCTOR MEMORY DEVICE

CROSS-REFERENCE TO RELATED APPLICATION

This application is based upon and claims the benefit of priority from Japanese Patent Application No. 2018-168624, Sep. 10, 2018; the entire contents of which are incorporated herein by reference.

FIELD

Embodiments described herein relate generally to a semiconductor memory device.

BACKGROUND

NAND-type flash memories in which memory cells are three-dimensionally laminated have been known.

DETAILED DESCRIPTION

Figure 1:
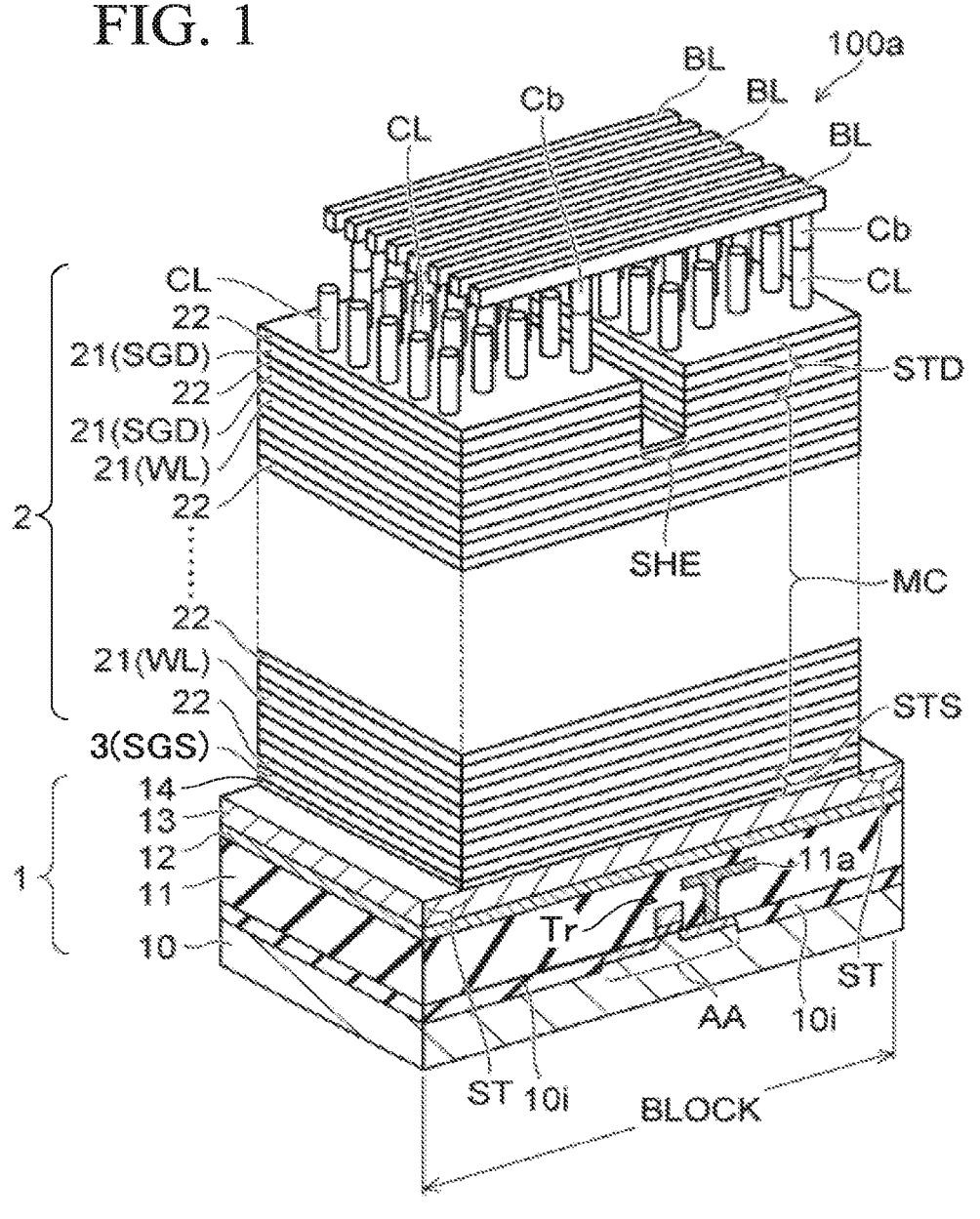
FIG. 1 is a perspective view showing a semiconductor memory device according to a first embodiment.

A semiconductor memory device according to an embodiment includes a base portion, a laminated body, a second conductive layer, and a columnar body. The base portion includes a first semiconductor portion. The laminated body includes a plurality of first conductive layers and a plurality of insulating layers which are alternately laminated in a first direction. The second conductive layer is positioned between the base portion and the laminated body. The columnar body is provided throughout an inside of the laminated body and an inside of the base portion. The columnar body includes a semiconductor body and a charge storage film. The charge storage film is provided between the semiconductor body and one of the plurality of first conductive layer. The semiconductor body includes a first region and a second region. The first region extends from a connection portion between the semiconductor body and the first semiconductor portion to an inside of the second conductive layer. The first region includes a first material. The second region is positioned closer to the laminated body than the first region is and is configured such that at least a portion is present within the second conductive layer. The second region does not include the first material or has a concentration of the first material which is lower than that in the first region. A first outer circumferential length of the semiconductor body within the second conductive layer is larger than a second outer circumferential length of the semiconductor body on a first surface which is an interface between the second conductive layer and the laminated body.

Hereinafter, a semiconductor memory device according to an embodiment will be described with reference to the accompanying drawings. In the following description, components having the same or similar functions are denoted by the same reference numerals. In addition, repeated descriptions of these components may be omitted. The drawings are schematic or conceptual, and relationships between the thickness and width of portions, the proportionality of sizes between portions, and the like are not necessarily the same as the actual values thereof. In the present specification, "connection" is not limited to a case of physical connection and also includes a case of electrical connection. In the present specification, "extending in an A direction" means that, for example, dimensions in the A direction are larger than the smallest dimensions among dimensions in an X-direction, a Y-direction, and a Z-direction to be described later. The "A direction" is an arbitrary direction.

In addition, first, an X-direction, a Y-direction, a +Z-direction, and a −Z-direction will be defined. The X-direction and the Y-direction are directions which are substantially parallel to the surface of a base portion 1 to be described later (see FIG. 1). The X-direction is a direction in which a slit ST to be described later extends. The Y-direction is a direction which intersects (for example, substantially perpendicularly) the X-direction. The Z-direction is a direction intersecting (for example, substantially perpendicularly) the X-direction and the Y-direction. The +Z-direction is a direction from the base portion 1 to be described later to a laminated body 2 to be described later (see FIG. 1). The −Z-direction is a direction opposite to the +Z-direction. In a case where the +Z-direction and the −Z-direction are not distinguished from each other, the directions will be simply referred to as a "Z-direction". In the present specification, the "+Z-direction" and the "−Z-direction" may be referred to "upward" and "downward", respectively. However, these expressions are for the sake of convenience only and do not define the direction of gravity. In the present embodiment, the +Z-direction is an example of a "first direction". The X-direction is an example of a "second direction".

First Embodiment

Figure 2:
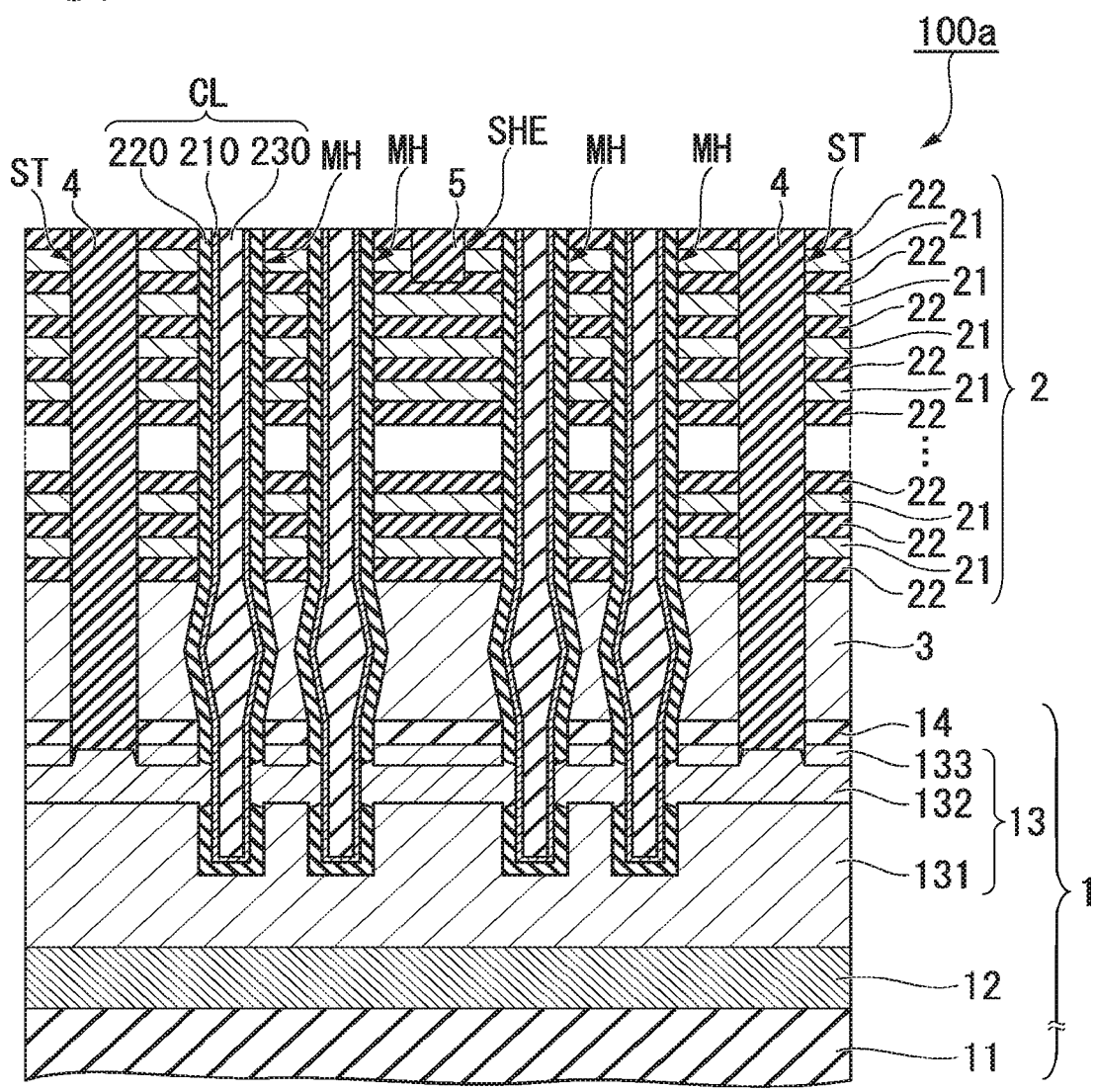
FIG. 2 is a cross-sectional view showing the semiconductor memory device according to the first embodiment.
Figure 2:
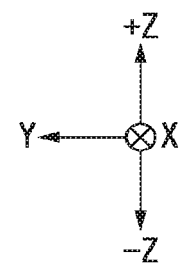

A semiconductor memory device 100a according to a first embodiment will be described. FIG. 1 is a perspective view showing a semiconductor memory device 100a according to the first embodiment. FIG. 2 is a cross-sectional view showing the semiconductor memory device 100a according to the first embodiment. The semiconductor memory device 100a is a non-volatile semiconductor memory device, and is, for example, a NAND-type flash memory.

The semiconductor memory device 100a includes, for example, the base portion 1, the laminated body 2, a second conductive layer 3, and a plurality of columnar bodies CL.

The base portion 1 includes, for example, a substrate 10, an interlayer insulating film 11, a third conductive layer 12, a first semiconductor portion 13, and an insulating film 14. The interlayer insulating film 11 is provided on the substrate 10. The third conductive layer 12 is provided on the interlayer insulating film 11. The first semiconductor portion 13 is provided on the third conductive layer 12. The insulating film 14 is provided on the first semiconductor portion 13.

The substrate 10 is a semiconductor substrate, and a peripheral circuit is disposed on the semiconductor substrate. For example, the substrate 10 is a silicon substrate. An element isolation region 10i is provided in a surface region of the substrate 10. The element isolation region 10i includes, for example, a silicon oxide. The element isolation region 10i partitions an active area AA. A source region and a drain region of a transistor Tr are provided in the active area AA. The transistor Tr is a portion of a peripheral circuit of a non-volatile semiconductor memory device.

The interlayer insulating film 11 is, for example, an insulating film including a silicon oxide film. The interlayer insulating film 11 insulates the transistor Tr from the third conductive layer 12. A wiring 11a is provided within the interlayer insulating film 11. The wiring 11a is electrically connected to the transistor Tr. The third conductive layer 12 contains various conductive materials such as a conductive metal, a metal silicide, and an impurity-doped polysilicon. The conductive metal is, for example, tungsten, and the metal silicide is, for example, a tungsten silicide.

The first semiconductor portion 13 is, for example, an n-type semiconductor. The first semiconductor portion 13 contains, for example, phosphorus. The first semiconductor portion 13 is, for example, silicon doped with phosphorus as an impurity. A portion of the silicon may be replaced with germanium. For example, impurities such as phosphorus are an example of a "first material".

The first semiconductor portion 13 includes a first semiconductor layer 131, a second semiconductor layer 132, and a third semiconductor layer 133 (see FIG. 2). The first semiconductor layer 131 is provided on the third conductive layer 12. The second semiconductor layer 132 is provided on the first semiconductor layer 131. The third semiconductor layer 133 is provided on the second semiconductor layer 132. The first semiconductor layer 131 is, for example, an n-type semiconductor. The first semiconductor layer 131 is, for example, impurity-doped polysilicon. The second semiconductor layer 132 is connected to a semiconductor body 210 to be described later of the columnar body CL. The second semiconductor layer 132 surrounds the vicinity of a portion in which a memory film 220 is removed in an XY plane. The second semiconductor layer 132 is, for example, an n-type semiconductor. The second semiconductor layer 132 is, for example, an impurity-doped epitaxial film. The third semiconductor layer 133 is, for example, an n-type or non-doped semiconductor.

The insulating film 14 contains, for example, a silicon oxide. The insulating film 14 may contain a high dielectric material having a relative permittivity higher than that of a silicon oxide. The high dielectric is, for example, a metal oxide. The metal oxide is, for example, an aluminum oxide.

The laminated body 2 is positioned to sandwich the second conductive layer 3 together with the base portion 1. The laminated body 2 alternately includes a plurality of conductive layers (first conductive layers) 21 and a plurality of insulating layers 22 in the Z-direction. The conductive layer 21 contains a conductive metal, for example, tungsten, impurity-doped polysilicon, and the like. The insulating layer 22 contains, for example, a silicon oxide. The number of laminated conductive layers 21 and the number of laminated insulating layers 22 are arbitrary.

The plurality of conductive layers 21 include a plurality of word lines WL and at least one drain-side selection gate SGD (see FIG. 1). The conductive layers 21 in the lower portion of the laminated body 2 may constitute a source-side selection gate SGS together with the second conductive layers 3. The plurality of word lines WL are positioned between the drain-side selection gate SGD and the source-side selection gate SGS. The word line WL is a gate electrode of a memory cell MC. The drain-side selection gate SGD is positioned in the upper portion of the laminated body 2. The drain-side selection gate SGD is a gate electrode of a drain-side selection transistor STD. The source-side selection gate SGS is positioned in the lower portion of the laminated body 2. The source-side selection gate SGS is a gate electrode of a source-side selection transistor STS.

The plurality of insulating layers 22 insulate the plurality of conductive layers 21 adjacent to each other. The thickness of the insulating layer 22 in the Z-direction which insulates the source-side selection gate SGS and the word line WL from each other may be larger than the thickness of the insulating layer 22 in the Z-direction which insulates the word lines WL from each other. A cover insulating film may be further provided on the insulating layer 22 which is the uppermost layer in the laminated body 2. The cover insulating film contains, for example, a silicon oxide.

The source-side selection transistor STS, the memory cell MC, and the drain-side selection transistor STD are connected to each other in series. A structure in which the source-side selection transistor STS, the memory cell MC, and the drain-side selection transistor STD are connected to each other in series is called a "memory string" or a "NAND string". The memory string is connected to bit lines BL through contacts Cb. The contact Cb is a conductor connecting the columnar body CL and the bit line BL to each other. The bit lines BL extend in the Y-direction above the laminated body 2.

Figure 3:
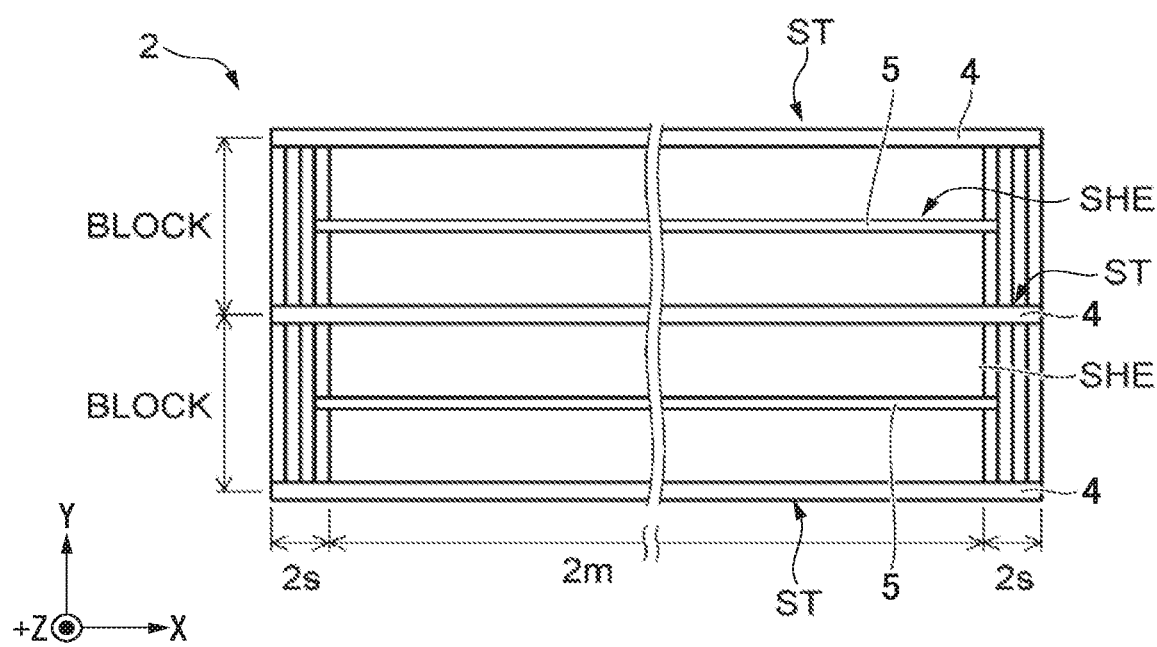
FIG. 3 is a plan view showing a laminated body of the semiconductor memory device according to the first embodiment.

FIG. 3 is a plan view showing the laminated body 2 of the semiconductor memory device 100a according to the first embodiment. The laminated body 2 is provided with a plurality of deep slits ST and a plurality of shallow slits SHE. The plurality of deep slits ST and the plurality of shallow slits SHE extend in the X-direction. The deep slits ST penetrate the laminated body 2 from the top face of the laminated body 2 to the base portion 1 (see FIG. 2). An insulator 4 is provided within the deep slit ST. The shallow slit SHE is provided from the upper end of the laminated body 2 to the middle of the laminated body 2 in the Z-direction (see FIG. 2). An insulator 5 is provided within the shallow slit SHE. The insulators 4 and 5 are, for example, silicon oxides.

A portion of the laminated body 2 interposed between two insulators 4 is called a block (BLOCK). The block is, for example, a minimum unit of data erasure. The insulator 5 is provided within the block. A portion of the laminated body 2 between the insulator 4 and the insulator 5 is called a finger. The drain-side selection gate SGD is sectioned for each finger. One finger in the block can be selected by the drain-side selection gate SGD at the time of data writing and reading.

The laminated body 2 includes stepped portions 2s and a memory cell array 2m. The stepped portions 2s are positioned at edge portions of the laminated body 2. The memory cell array 2m is interposed between a pair of stepped portions 2s. In addition, the stepped portion 2s may surround the memory cell array 2m. The deep slit ST extends from the stepped portion 2s at a first end of the laminated body 2 to the stepped portion 2s at a second end of the laminated body 2 through the memory cell array 2m. The shallow slit SHE is provided in at least the memory cell array 2m.

A plurality of columnar bodies CL are provided within the memory cell array 2m. The plurality of columnar bodies CL respectively selected from the fingers are connected to one bit line BL through the contacts Cb.

The plurality of columnar bodies CL are provided in the memory hole MH within the laminated body 2 (see FIG. 2). The memory hole MH is provided from the upper end of the laminated body 2 to the inside of the laminated body 2 and the inside of the first semiconductor portion 13. The shape of the memory hole MH in the XY plane is, for example, a circular shape or an elliptical shape.

Figure 4:
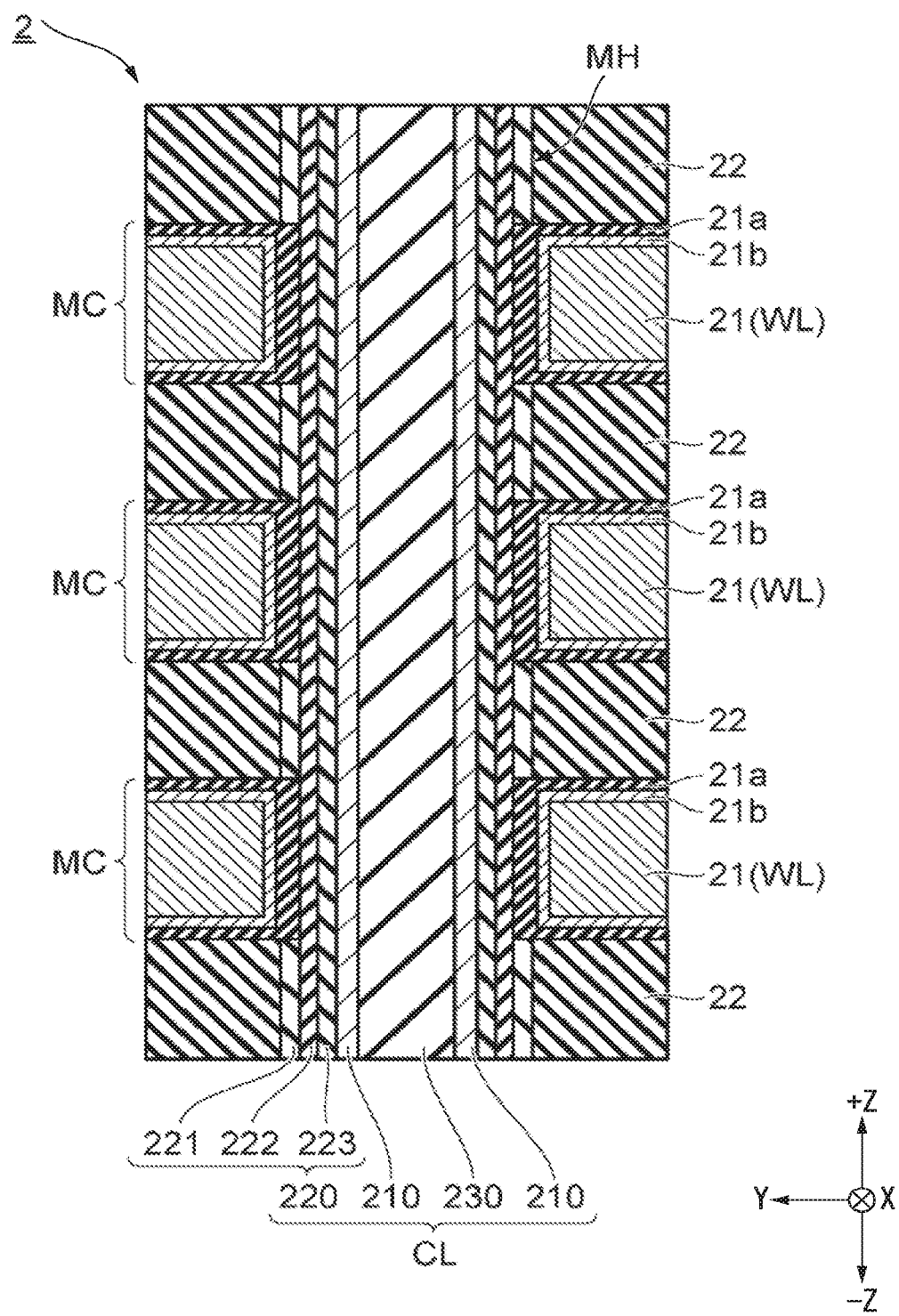
FIG. 4 is an enlarged cross-sectional view of the vicinity of a columnar body of the semiconductor memory device according to the first embodiment.
Figure 5:
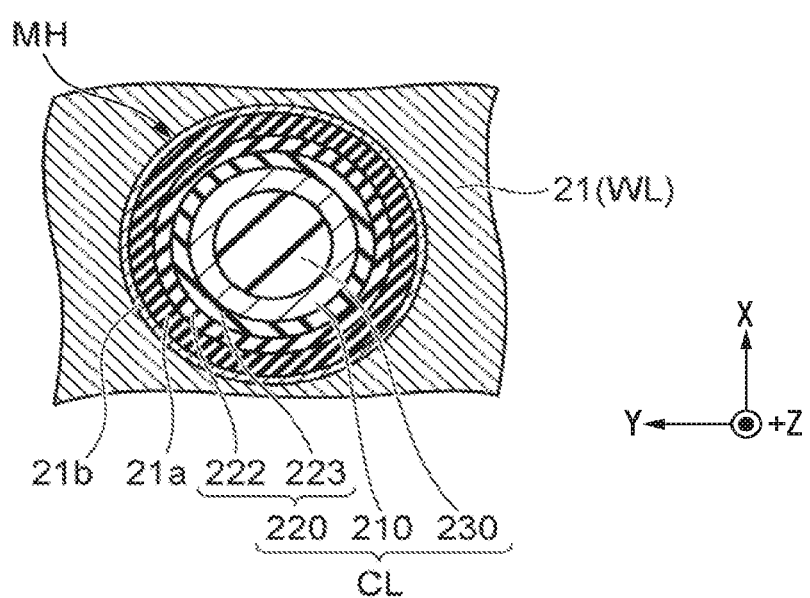
FIG. 5 is an enlarged cross-sectional view of the vicinity of the columnar body of the semiconductor memory device according to the first embodiment.

FIG. 4 is an enlarged cross-sectional view of the vicinity of the columnar body CL of the semiconductor memory device 100a according to the first embodiment. FIG. 5 is an enlarged cross-sectional view in the XY plane showing the vicinity of the columnar body CL of the semiconductor memory device 100a according to the first embodiment. Each of the plurality of columnar bodies CL includes a semiconductor body 210, a memory film 220, and a core portion 230.

The semiconductor body 210 has a bottomed tubular shape extending in the Z-direction. The semiconductor body 210 contains, for example, silicon. The silicon is, for example, polysilicon obtained by crystallizing amorphous silicon. The semiconductor body 210 is a channel of each of the drain-side selection transistor STD, the memory cell MC, and the source-side selection transistor STS. The channel is a flow path of carriers between the source side and the drain side.

The memory film 220 extends in the Z-direction and is positioned between an inner wall of the memory hole MH and an outer wall of the semiconductor body 210. The memory film 220 includes, for example, a cover insulating film 221, a charge storage film 222, and a tunnel insulating film 223. A portion of the memory film 220 is removed at a position where the memory film is connected to the second semiconductor layer 132 (see FIG. 6). The semiconductor body 210 and the second semiconductor layer 132 are connected to each other by removing the memory film 220.

The cover insulating film 221 is positioned between the insulating layer 22 and the charge storage film 222. The cover insulating film 221 contains, for example, a silicon oxide. The cover insulating film 221 protects the charge storage film 222 from etching during processing. The cover insulating film 221 may not be provided or may be partially left between the conductive layer 21 and the charge storage film 222 so as to be used as a block insulating film.

The charge storage film 222 is positioned between the conductive layer 21, the insulating layer 22, and the tunnel insulating film 223. The charge storage film 222 contains, for example, a silicon nitride. Each of intersections between the charge storage film 222 and the plurality of conductive layers 21 functions as a transistor. The memory cell MC holds data according to the presence or absence of charge within a charge storage portion in which the charge storage film 222 and the plurality of conductive layers 21 intersect each other or the amount of charge stored. The charge storage film 222 may have a floating gate structure in which a conductive material surrounded by an insulating material is provided between one conductive layer 21 and the semiconductor body 210.

The tunnel insulating film 223 is positioned between the charge storage film 222 and the semiconductor body 210. The tunnel insulating film 223 contains, for example, a silicon oxide, or contains a silicon oxide and a silicon nitride. The tunnel insulating film 223 is a potential barrier between the semiconductor body 210 and the charge storage film 222.

The core portion 230 is embedded in the semiconductor body 210. The shape of the core portion 230 is a columnar shape. The core portion 230 contains, for example, a silicon oxide.

In addition, as shown in FIG. 4, a block insulating film 21a and a barrier film 21b may be provided between the conductive layer 21 and the insulating layer 22 of the laminated body 2 and between the conductive layer 21 and the memory film 220. The block insulating film 21a suppresses back-tunneling. Back-tunneling is a phenomenon in which charge returns from the conductive layer 21 to the memory film 220. The barrier film 21b improves adhesion between the conductive layer 21 and the block insulating film 21a. The block insulating film 21a is, for example, a silicon oxide film or a metal oxide film. An example of a metal oxide is an aluminum oxide. For example, in a case where the conductive layer 21 is tungsten, the barrier film 21b is a laminated structure film of a titanium nitride and titanium as an example.

The second conductive layer 3 is positioned between the base portion 1 and the laminated body 2 (see FIG. 2). The second conductive layer 3 is positioned between the insulating layer 22 which is the lowermost surface of the laminated body 2 and the insulating film 14. The second conductive layer 3 is, for example, a metal or a semiconductor. A metal used for the second conductive layer 3 is, for example, tungsten. A semiconductor used for the second conductive layer 3 is, for example, phosphorus-doped silicon. The second conductive layer 3 applies a voltage to the columnar body CL to generate holes inside the semiconductor body 210. The second conductive layer 3 functions as a source-side selection gate SGS.

Figure 6:
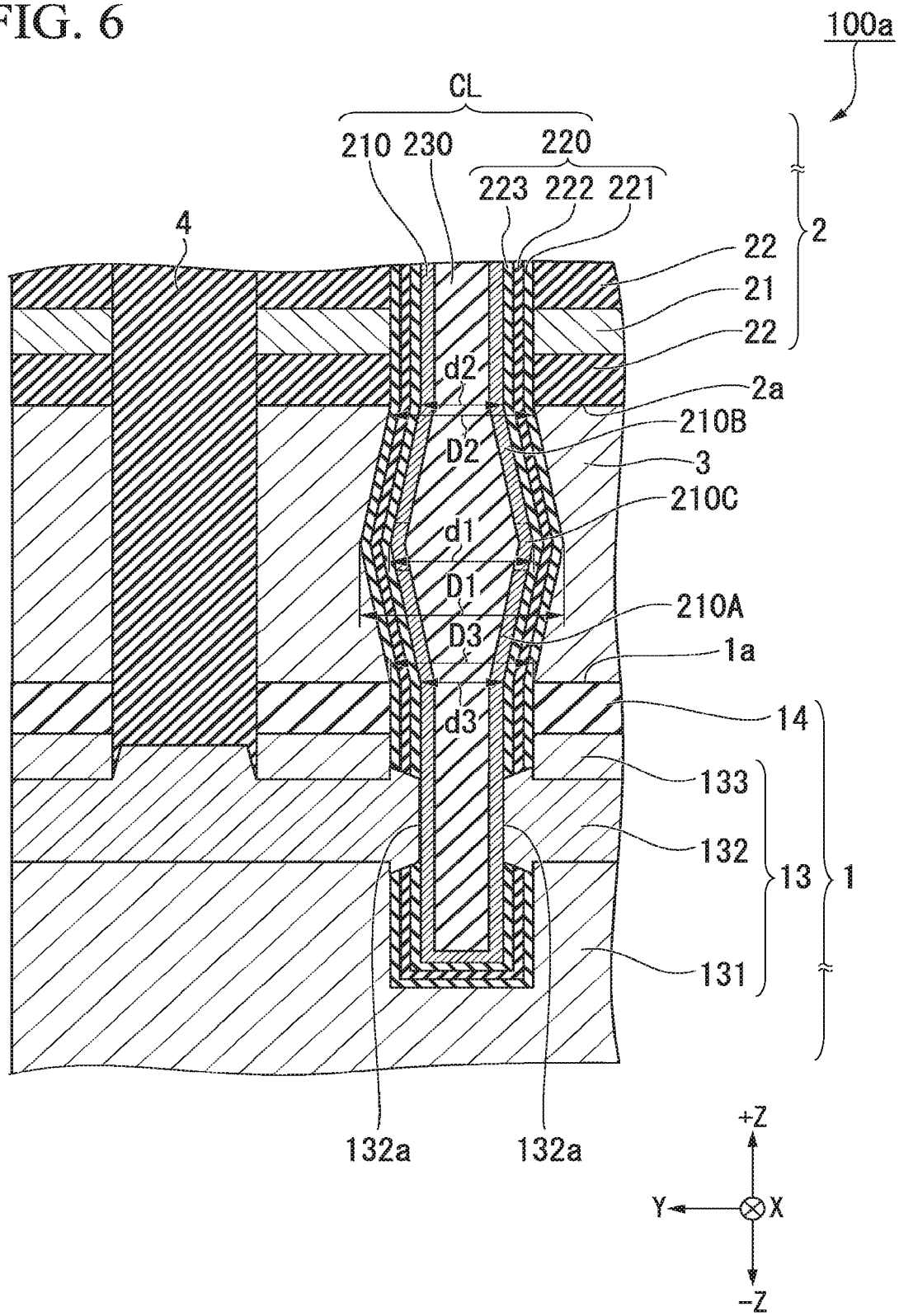
FIG. 6 is an enlarged cross-sectional view showing the columnar body, a first semiconductor portion, and a second conductive layer of the semiconductor memory device according to the first embodiment.

FIG. 6 is an enlarged cross-sectional view of the columnar body CL, the first semiconductor portion 13, and the second conductive layer 3 of the semiconductor memory device 100a according to the first embodiment.

A first outer circumferential length of the semiconductor body 210 is larger than a second outer circumferential length. Hereinafter, in the description of a size relationship between "outer circumferential lengths" of the semiconductor body 210 and the columnar body CL, a size relationship between "outer circumferential lengths" will be described by taking an "outer diameter" in a case where the cross-section of the semiconductor body 210 or the columnar body CL has a cylindrical shape as an example. However, the "outer diameter" is an example of an "outer circumferential length", and the cross-sectional shapes of the semiconductor body 210 and the columnar body CL are not limited to a cylindrical shape.

A first outer diameter d1 is the outer diameter of the semiconductor body 210 within the second conductive layer 3. The first outer diameter d1 is, for example, the maximum diameter of the semiconductor body 210 within the second conductive layer 3.

A second outer diameter d2 is the outer diameter of the semiconductor body 210 on the first surface 2a of the laminated body 2. The first surface 2a is a surface which is in contact with the second conductive layer 3 of the laminated body 2. For example, the first surface 2a is an interface between the second conductive layer 3 and the laminated body 2. For example, the first surface 2a is the surface of the insulating layer 22 which is closest to the second conductive layer 3 among the plurality of insulating layers 22 included in the laminated body 2 and is a surface facing with the second conductive layer 3. In addition, for example, the first surface 2a is an interface between the laminated body 2 and the second semiconductor layer 3.

In a case where the shape of the semiconductor body 210 in the XY plane is not a circular shape or the outer circumference of the semiconductor body 210 is not continuous, the diameter of the circumscribed circle of the semiconductor body 210 in the XY plane is the outer diameter of the semiconductor body 210.

The first outer diameter d1 is, for example, 10% or more larger than the second outer diameter d2, is 20% or more larger than the second outer diameter d2 in an example, and is 30% or more larger than the second outer diameter d2 in another example.

The first outer diameter d1 of the semiconductor body 210 is larger than a third outer diameter d3.

The third outer diameter d3 is the outer diameter of the semiconductor body 210 on the second surface 1a of the base portion 1. The second surface 1a is a surface which is in contact with the second conductive layer 3 of the base portion 1. For example, the second surface 1a, which is the surface of the insulating film 14 included in the base portion 1, is a surface facing the second conductive layer 3. In addition, for example, the second surface 1a is an interface between the base portion 1 and the second semiconductor layer 3.

The first outer diameter d1 is, for example, 10% or more larger than the third outer diameter d3, is 20% or more larger than the third outer diameter d3 in an example, and is 30% or more larger than the third outer diameter d3 in another example.

The outer diameter of the semiconductor body 210 shown in FIG. 6 changes within the second conductive layer 3. For example, the semiconductor body 210 within the second conductive layer 3 has a maximum outer diameter of the semiconductor body 210 at a position in the middle of the second conductive layer 3 in the Z-direction. For example, the semiconductor body 210 broadens from the second outer diameter d2 toward the first outer diameter d1 and broadens from the third outer diameter d3 toward the first outer diameter d1. The outer diameter of the semiconductor body 210 changes continuously from the second outer diameter d2 toward the third outer diameter d3, and the first outer diameter d1 is the maximum outer diameter of the semiconductor body 210. The side surface of the semiconductor body 210 has a convex shape outward at a position surrounded by the second conductive layer 3. The side surface of the semiconductor body 210 may be bent or curved outward. An outward direction refers to a direction from the core portion 230 of the columnar body CL toward the memory film 220.

As described above, the columnar body CL includes the memory film 220 on the outer side of the semiconductor body 210. Film thicknesses of respective layers of the memory film 220 are substantially the same as each other in the Z-direction. The lateral surface of the columnar body CL reflects the shape of the lateral surface of the semiconductor body 210.

A first outer diameter D1 of the columnar body CL is larger than a second outer diameter D2. The first outer diameter D1 is the outer diameter of the columnar body CL within the second conductive layer 3. The first outer diameter D1 is, for example, the outer diameter of the columnar body CL at a position where the outer diameter of the columnar body CL is a maximum within the second conductive layer 3. The second outer diameter D2 is the outer diameter of the columnar body CL on the first surface 2a of the laminated body 2. In a case where the shape of the columnar body CL in the XY plane is not a circular shape or the outer circumference of the columnar body CL is not continuous, the outer diameter of the columnar body CL means the outer diameter of the circumscribed circle of the columnar body CL in the XY plane.

The first outer diameter D1 of the columnar body CL is larger than a third outer diameter D3. The third outer diameter D3 is the outer diameter of the columnar body CL on the second surface 1a of the base portion 1.

The outer diameter of the columnar body CL shown in FIG. 6 changes within the second conductive layer 3. For example, the outer diameter of the columnar body CL within the second conductive layer 3 increases from the second outer diameter D2 toward the first outer diameter D1 and increases from the third outer diameter D3 toward the first outer diameter D1. The outer diameter of the columnar body CL changes continuously from the second outer diameter D2 toward the third outer diameter D3 and is set to a maximum value in the first outer diameter D1. The side surface of the columnar body CL has a convex shape outward at a position surrounded by the second conductive layer 3. The side surface of the columnar body CL may be bent or curved outward.

In addition, the semiconductor body 210 includes a first region 210A, a second region 210B, and a third region 210C.

The first region 210A is positioned at a lower portion of the semiconductor body 210. The first region 210A extends from a connection portion 132a between the semiconductor body 210 and the first semiconductor portion 13 to a position facing the second conductive layer 3. The first region 210A contains, for example, phosphorus as an impurity. In addition, the first region 210A may contain germanium in addition to phosphorus. For example, the first region 210A is an n$^+$-type semiconductor, and the impurity concentration thereof is equal to or greater than $1 \times 10^{20}$ cm$^{-3}$.

The second region 210B is positioned closer to the laminated body 2 than the first region 210A is, and at least a portion of the second region is present at a position facing the second conductive layer 3. The second region 210B does not contain impurities or has a lower impurity concentration than the first region 210A. For example, the second region 210B is an intrinsic semiconductor or an n-type semiconductor, and the impurity concentration thereof is less than $1 \times 10^{19}$.

The third region 210C is positioned between the first region 210A and the second region 210B. The third region 210C is present within the second conductive layer 3. The impurity concentration of the third region 210C is equal to or greater than $1\times10^{19}$ cm$^{-3}$ and less than $1\times10^{20}$ cm$^{-3}$. For example, the semiconductor body 210 within the second conductive layer 3 has a maximum outer diameter within the third region 210C.

The impurity concentration of the first region 210A gradually decreases in the +Z-direction. The impurities of the first region 210A diffuse from the first semiconductor portion 13. The impurity concentration of the first region 210A is highest in the connection portion 132a with the first semiconductor portion 13 and decreases in the +Z-direction. An impurity concentration in the connection portion 132a is lower than an impurity concentration in the second region 210B.

Subsequently, a method of manufacturing the semiconductor memory device 100a according to the first embodiment will be described. FIGS. 7 to 14 to be described below are cross-sectional views showing an example of a method of manufacturing the semiconductor memory device 100a according to the first embodiment.

First, the element isolation region 10i is formed within the substrate 10, and the transistor Tr is formed within the active area AA (see FIG. 1). The transistor Tr can be manufactured using a known method.

Figure 7:
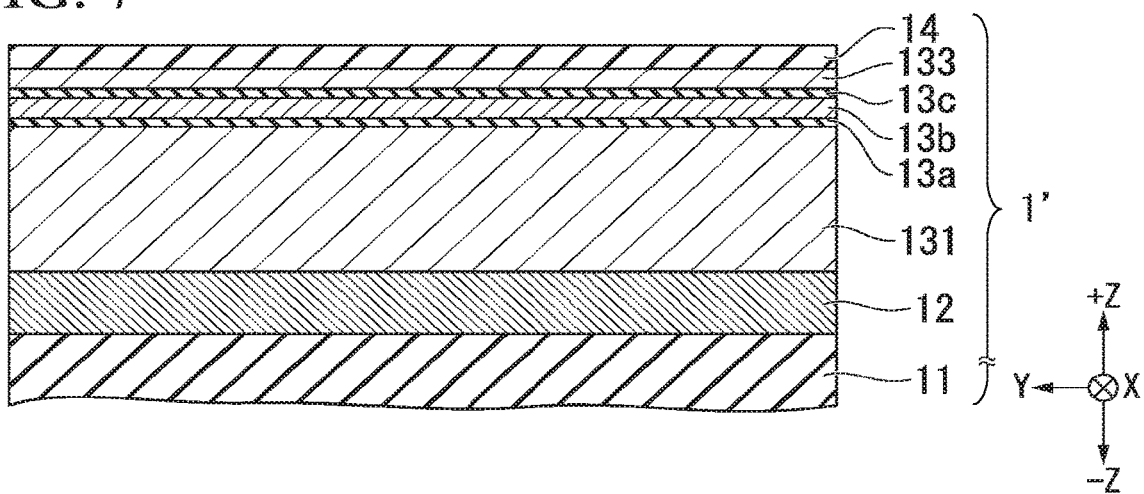
FIG. 7 is a cross-sectional view showing an example of a method of manufacturing the semiconductor memory device according to the first embodiment.

The interlayer insulating film 11 and the third conductive layer 12 are laminated on the substrate 10 in this order (see FIG. 7). In FIGS. 7 to 14, only an upper portion of the interlayer insulating film 11 is shown, and the substrate 10, the transistor Tr, and the like are not shown. The wiring 11a and the like are formed within the interlayer insulating film 11.

Subsequently, the first semiconductor layer 131, a first intermediate film 13a, a first sacrificial film 13b, a second intermediate film 13c, the third semiconductor layer 133, and the insulating film 14 are laminated on the third conductive layer 12 in this order. The first semiconductor layer 131 contains, for example, n-type doped silicon. The first semiconductor layer 131 is doped with, for example, phosphorus as an impurity. The first semiconductor layer 131 may be doped with, for example, germanium so that a portion of silicon is replaced with germanium. The first intermediate film 13a and the second intermediate film 13c contain, for example, a silicon oxide. The first sacrificial film 13b and the third semiconductor layer 133 contain, for example, p-type doped silicon, n-type doped silicon, or non-doped silicon. The insulating film 14 contains, for example, a silicon oxide or a metal oxide. As shown in FIG. 7, a base portion 1' is obtained during the manufacture.

Figure 8:
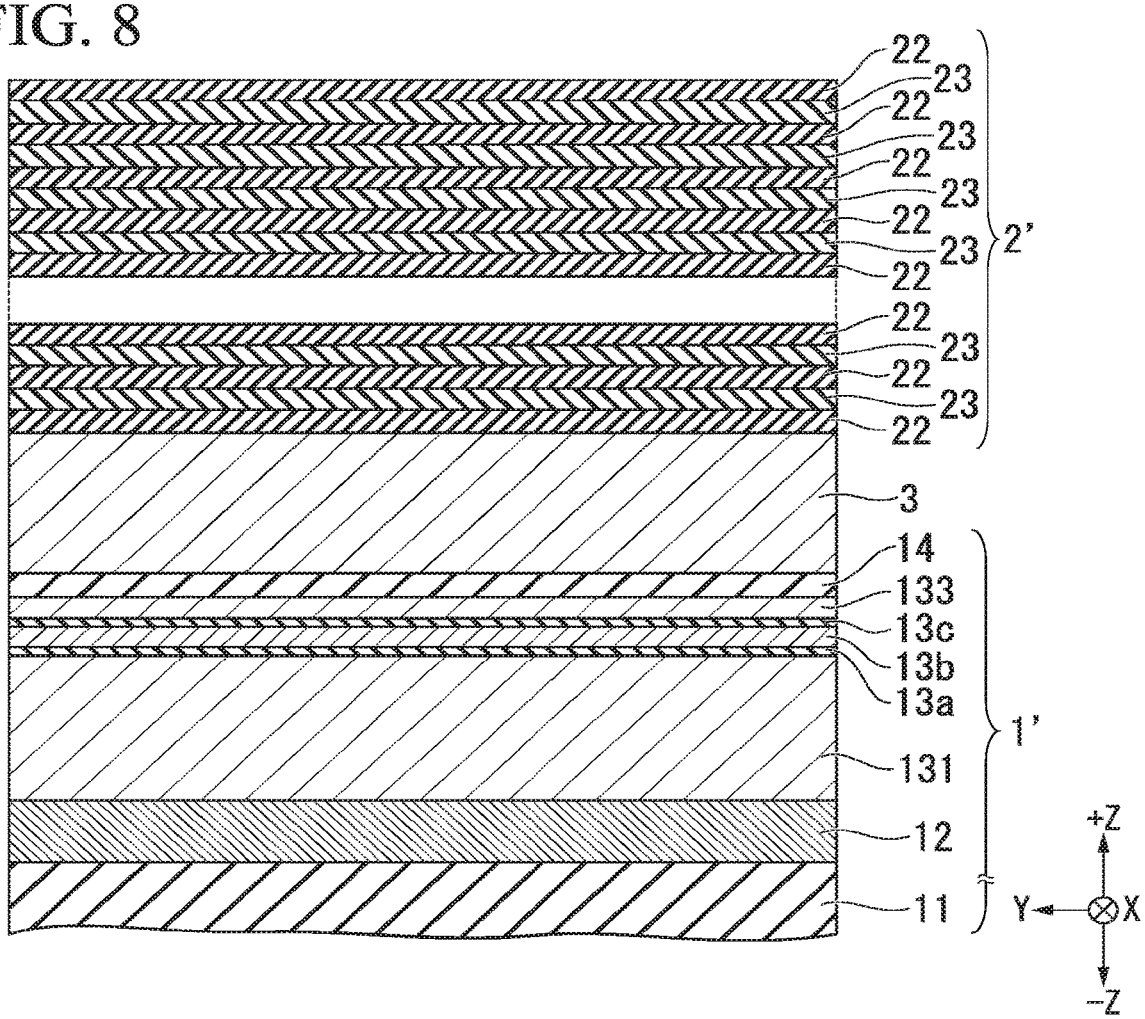
FIG. 8 is a cross-sectional view showing an example of a method of manufacturing the semiconductor memory device according to the first embodiment.

The second conductive layer 3 is formed on the insulating film 14 (see FIG. 8). The second conductive layer 3 contains, for example, n-type doped silicon. Subsequently, the insulating layer 22 and the second sacrificial film 23 are alternately laminated in this order from a position close to the second conductive layer 3. The insulating layer 22 contains, for example, a silicon oxide, and the second sacrificial film 23 contains, for example, a silicon nitride. As shown in FIG. 8, the insulating layer 22 and the second sacrificial film 23 constitute a laminated body 2' during the manufacture.

Figure 9:
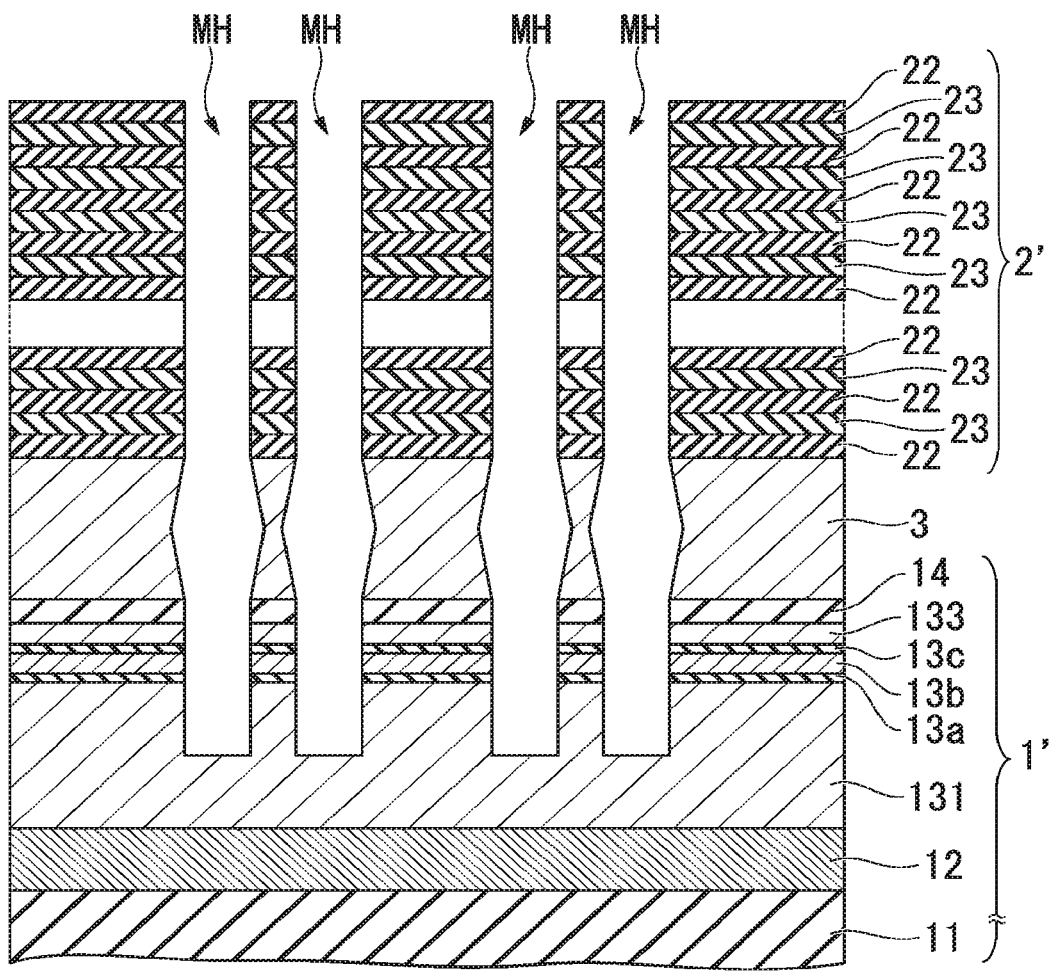
FIG. 9 is a cross-sectional view showing an example of a method of manufacturing the semiconductor memory device according to the first embodiment.
Figure 9:
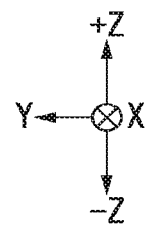

The memory hole MH is formed from the laminated body 2' to the base portion 1' (see FIG. 9). The memory hole MH is manufactured by etching. First, anisotropic etching is performed from the top face of the laminated body 2' to the second conductive layer 3. For example, reactive ion etching (RIE) is used as the anisotropic etching. Subsequently, further etching is performed by changing an etching gas. The etching gas is changed to an etchant capable of etching silicon more rapidly than a silicon oxide and a metal oxide. The diameter of the memory hole MH within the second conductive layer 3 is increased within the second conductive layer 3, for example, by changing the etching gas and oxidizing the inner wall of the memory hole MH within the second conductive layer 3. The memory hole MH extends from the top face of the laminated body 2' to the middle of the first semiconductor layer 131.

Figure 10:
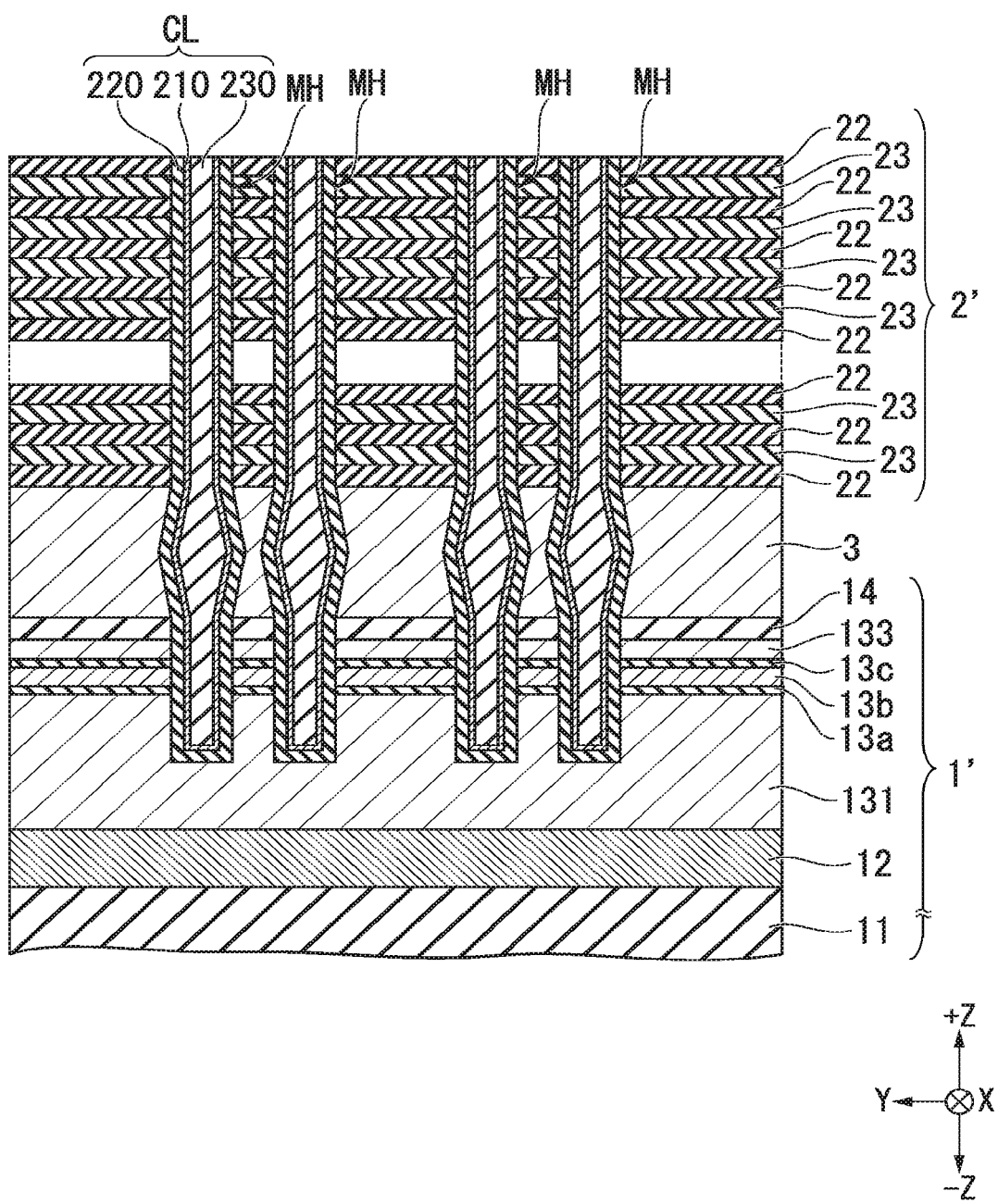
FIG. 10 is a cross-sectional view showing an example of a method of manufacturing the semiconductor memory device according to the first embodiment.

The memory film 220, the semiconductor body 210, and the core portion 230 are formed within the memory hole MH in this order (see FIG. 10). The memory film 220 contains a silicon nitride and a silicon oxide. The semiconductor body 210 contains non-doped silicon or n-type doped silicon. The core portion 230 contains a silicon oxide. The memory hole MH is embedded in the memory film 220, the semiconductor body 210, and the core portion 230, thereby forming the columnar body CL.

Figure 11:
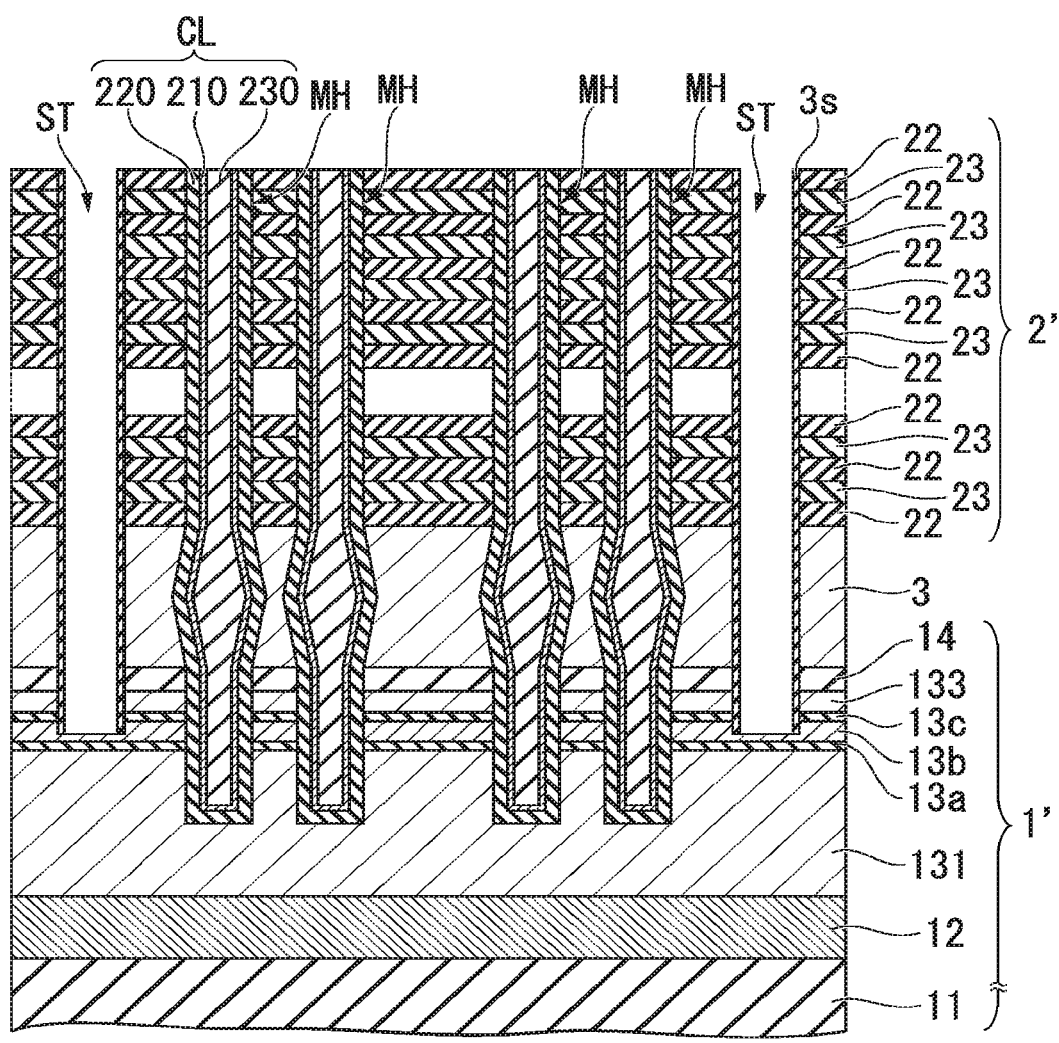
FIG. 11 is a cross-sectional view showing an example of a method of manufacturing the semiconductor memory device according to the first embodiment.
Figure 11:
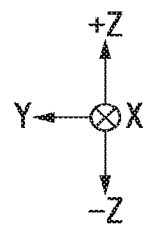

A deep slit ST is formed from the laminated body 2' to the base portion 1' (see FIG. 11). The deep slit ST is formed by anisotropic etching. The deep slit ST extends from the top face of the laminated body 2' to the first sacrificial film 13b. A first stopper film 3s is formed on the side wall of the deep slit ST. The first stopper film 3s is, for example, a silicon nitride film.

Figure 12:
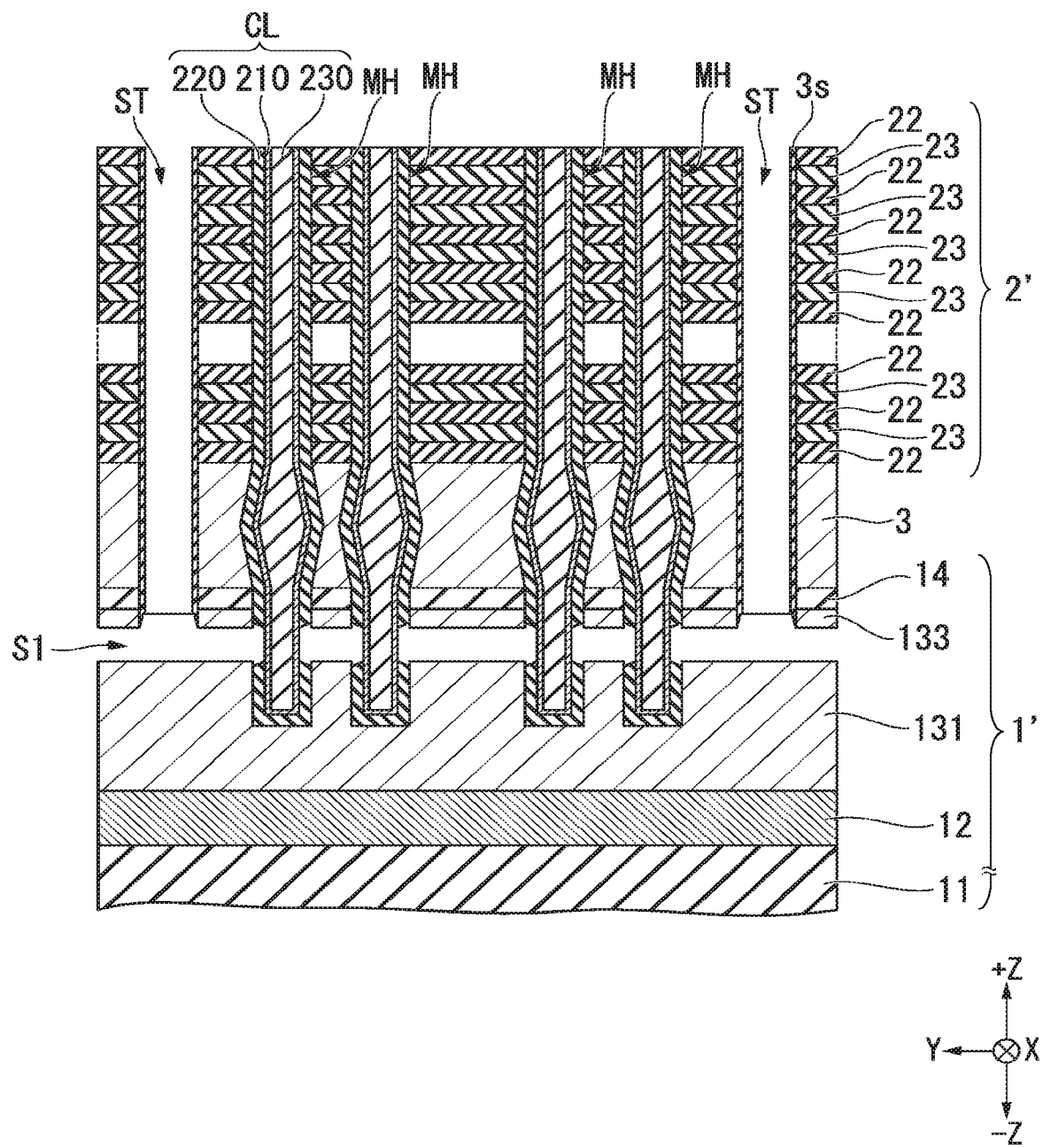
FIG. 12 is a cross-sectional view showing an example of a method of manufacturing the semiconductor memory device according to the first embodiment.

Isotropic etching of the first sacrificial film 13b is performed through the deep slit ST (see FIG. 12). The first sacrificial film 13b is removed by isotropic etching. The isotropic etching is performed using an etchant capable of etching n-type doped silicon or non-doped silicon more rapidly than a silicon oxide and a silicon nitride.

Subsequently, a portion of the memory film 220 is removed through the deep slit ST. A portion of the memory film 220 is removed by isotropic etching. A portion of the memory film 220 which is exposed due to the removal of the first sacrificial film 13b is removed. The etching of the memory film 220 is performed using an etchant capable of etching a silicon oxide more rapidly than a silicon nitride. The first intermediate film 13a and the second intermediate film 13c are removed at the same time as the memory film 220. A first space S1 is formed between the first semiconductor layer 131 and the third semiconductor layer 133.

Figure 13:
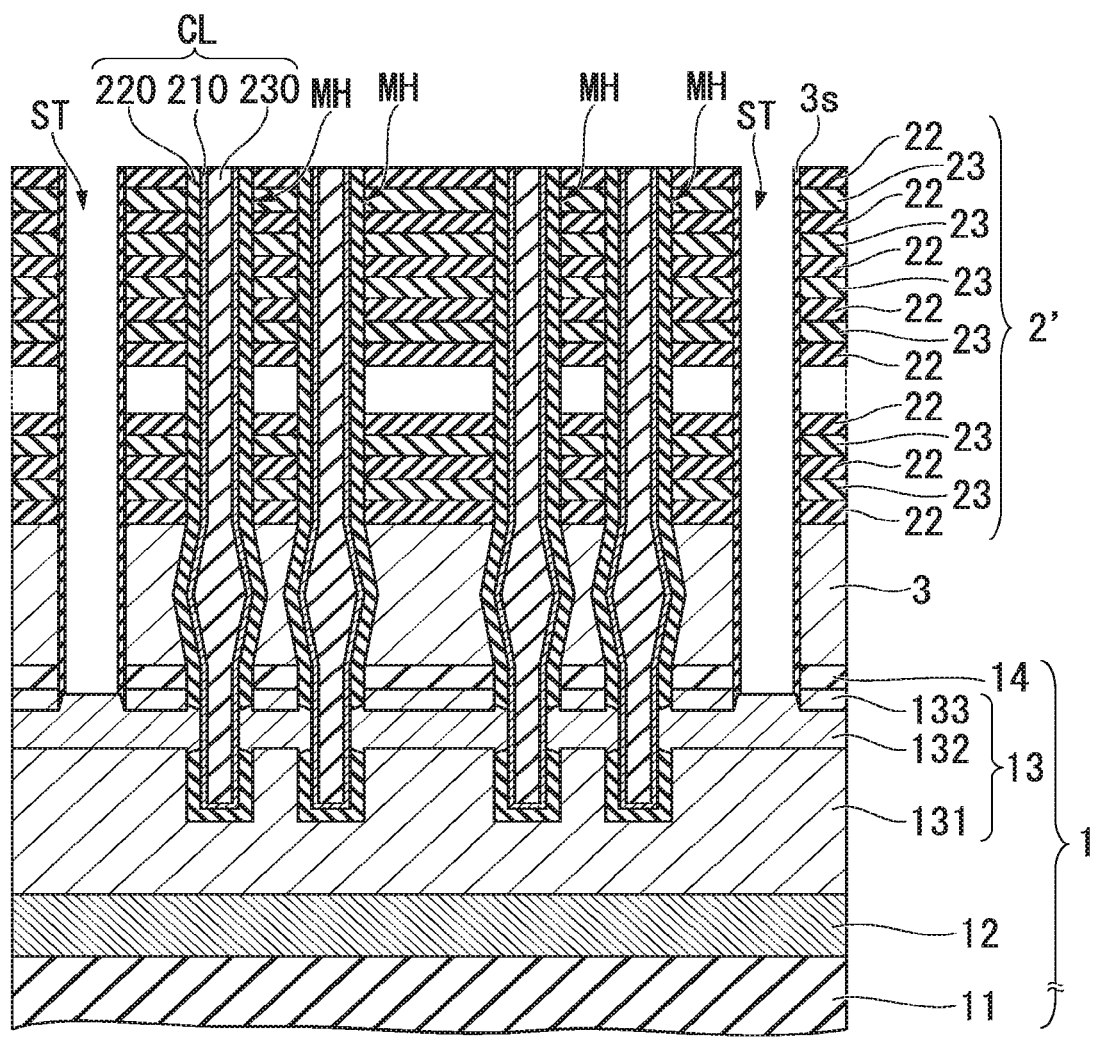
FIG. 13 is a cross-sectional view showing an example of a method of manufacturing the semiconductor memory device according to the first embodiment.
Figure 13:
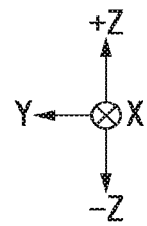

The first space S1 is filled with a semiconductor through the deep slit ST (see FIG. 13). The second semiconductor layer 132 is formed within the first space S1. The second semiconductor layer 132 is, for example, n-type doped silicon. The base portion 1' becomes the base portion 1 by providing the second semiconductor layer 132.

Figure 14:
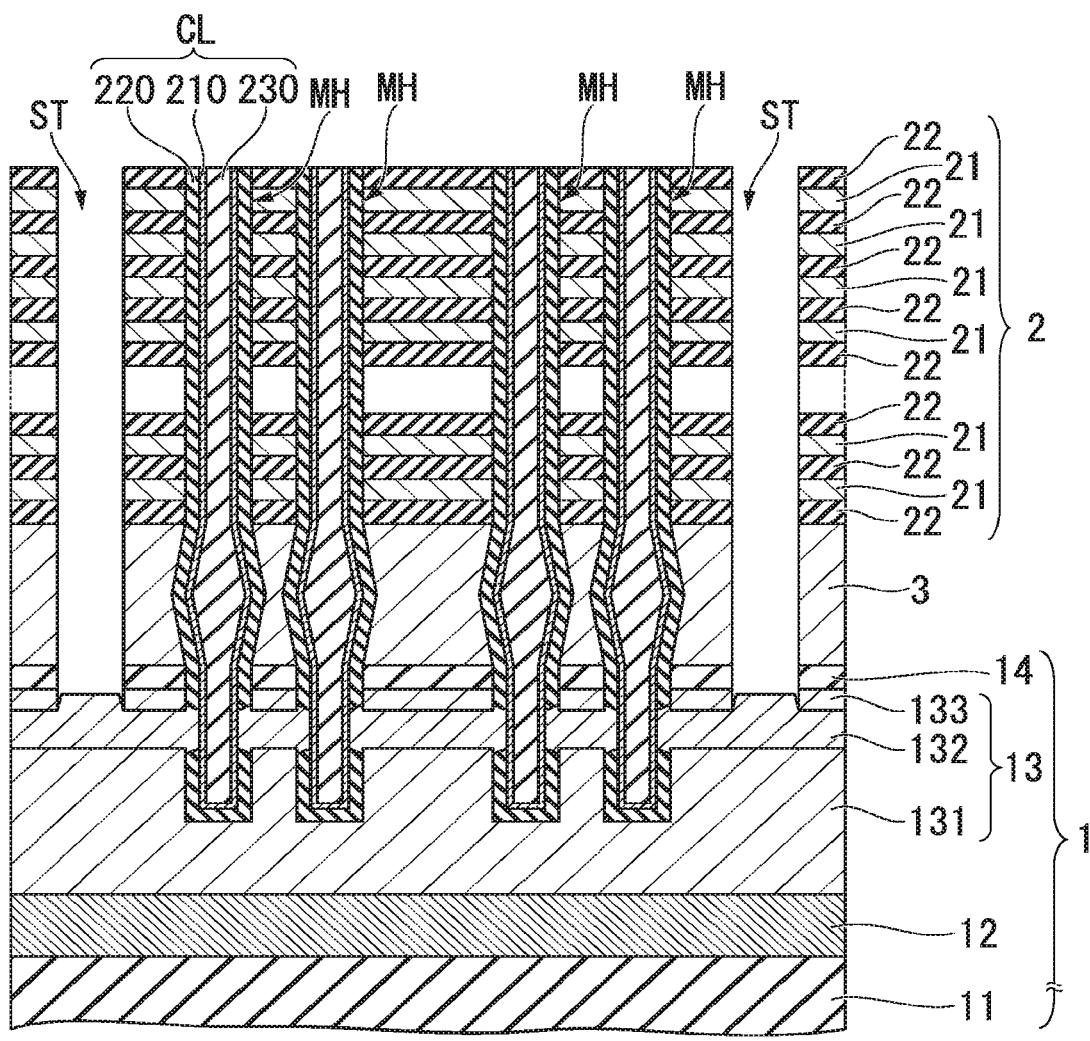
FIG. 14 is a cross-sectional view showing an example of a method of manufacturing the semiconductor memory device according to the first embodiment.
Figure 14:
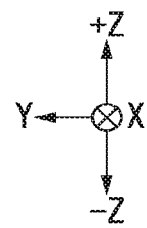

Subsequently, the second sacrificial film 23 is replaced with the conductive layer 21 (see FIG. 14). First, the first stopper film 3s and the second sacrificial film 23 are removed through the deep slit ST. The first stopper film 3s and the second sacrificial film 23 are removed by isotropic etching. The isotropic etching uses an etchant capable of etching a silicon nitride more rapidly than a silicon oxide and polysilicon. Thereafter, a portion in which the second sacrificial film 23 is removed is filled with a conductive material, thereby forming the conductive layer 21. The conductive layer 21 contains, for example, tungsten. The laminated body 2' becomes the laminated body 2 by providing the conductive layer 21.

Subsequently, the deep slit ST is filled with the insulator 4. In addition, the shallow slit SHE is formed to the middle of the laminated body 2, and the shallow slit SHE is filled with the insulator 5. The insulator 4 and the insulator 5 contain a silicon oxide. The shallow slit SHE is formed by anisotropic etching.

The semiconductor memory device 100a shown in FIG. 2 is manufactured through the above-described steps. The semiconductor memory device 100a manufactured is heated in a later step. The impurities with which the first semiconductor layer 132 is doped are diffused to the semiconductor body 210 by heating. In a case where a portion of silicon for forming the first semiconductor layer 132 is replaced with germanium, the germanium is also diffused to the semiconductor body 210 by heating. The first region 210A of the semiconductor body 210 is formed by, for example, thermal diffusion through heating. The manufacturing steps described here are examples, and other steps may be inserted between the steps.

According to the semiconductor memory device 100a of the first embodiment, it is possible to achieve an improvement in the speed of a data erasure operation. The semiconductor memory device 100a stores data by charge stored in a charge storage portion. When holes are injected into the charge storage portion, data is erased. The holes are supplied from the semiconductor body 210 to the charge storage portion.

The semiconductor body 210 generates holes by gate-induced drain leakage (GIDL). The GIDL occurs when voltages in opposite directions are respectively applied to a drain and a gate. Holes are generated by applying voltages in opposite directions to the columnar body CL and the second conductive layer 3. When holes are sufficiently stored within the columnar body CL, data is erased. When the amount of holes generated due to GIDL is small, it takes time to erase data.

When a voltage is applied to the second conductive layer 3, GIDL occurs in the semiconductor body 210, thereby generating holes. In other words, holes are generated within the semiconductor body 210 surrounded by the second conductive layer 3. As shown in FIG. 6, the outer diameter of the semiconductor body 210 is large at a position where the semiconductor body is surrounded by the second conductive layer 3. When the cross-sectional area of the semiconductor body 210 in the XY plane increases, the amount of holes generated in the semiconductor body 210 is increased. When the amount of holes generated is increased, time until holes are sufficiently stored in the columnar body CL is reduced. Holes are rapidly supplied from the semiconductor body 210 to a charge storage portion of each of the columnar bodies CL, and thus the speed of a data erasure operation is improved.

GIDL tends to occur in the third region 210C having an impurity concentration equal to or greater than $1\times10^{19}$ cm$^{-3}$ and less than $1\times10^{20}$ cm$^{-3}$. When the outer diameter of the semiconductor body 210 within the second conductive layer 3 is maximized within the third region 210C, the amount of holes generated within the semiconductor body 210 is more increased. That is, a data erasure operation of the semiconductor memory device 100a is more improved.

In addition, the side surface of the semiconductor body 210 has a convex shape outward at a position where the semiconductor body is surrounded by the second conductive layer 3, and thus an electric field tends to be concentrated on a portion in which the semiconductor body 210 has a maximum outer diameter. An electric field is concentrated on the semiconductor body 210 within the second conductive layer 3, and thus the amount of holes generated in the semiconductor body 210 is increased. Time until holes are sufficiently stored within the columnar body CL is reduced, and the speed of a data erasure operation is more improved.

In addition, when the semiconductor body 210 contains germanium in addition to impurities, a band gap of the semiconductor body 210 becomes narrow. When the band gap of the semiconductor body 210 is narrow, electrons are easily excited from a valance band to a conduction band, and the amount of holes generated is increased. That is, a data erasure operation of the semiconductor memory device 100a is more improved. When germanium is contained in the third region 210C of the semiconductor body 210, electrons are easily excited, and the amount of holes generated is particularly increased.

First Modification Example

Next, a first modification example of the embodiment will be described.

Figure 15:
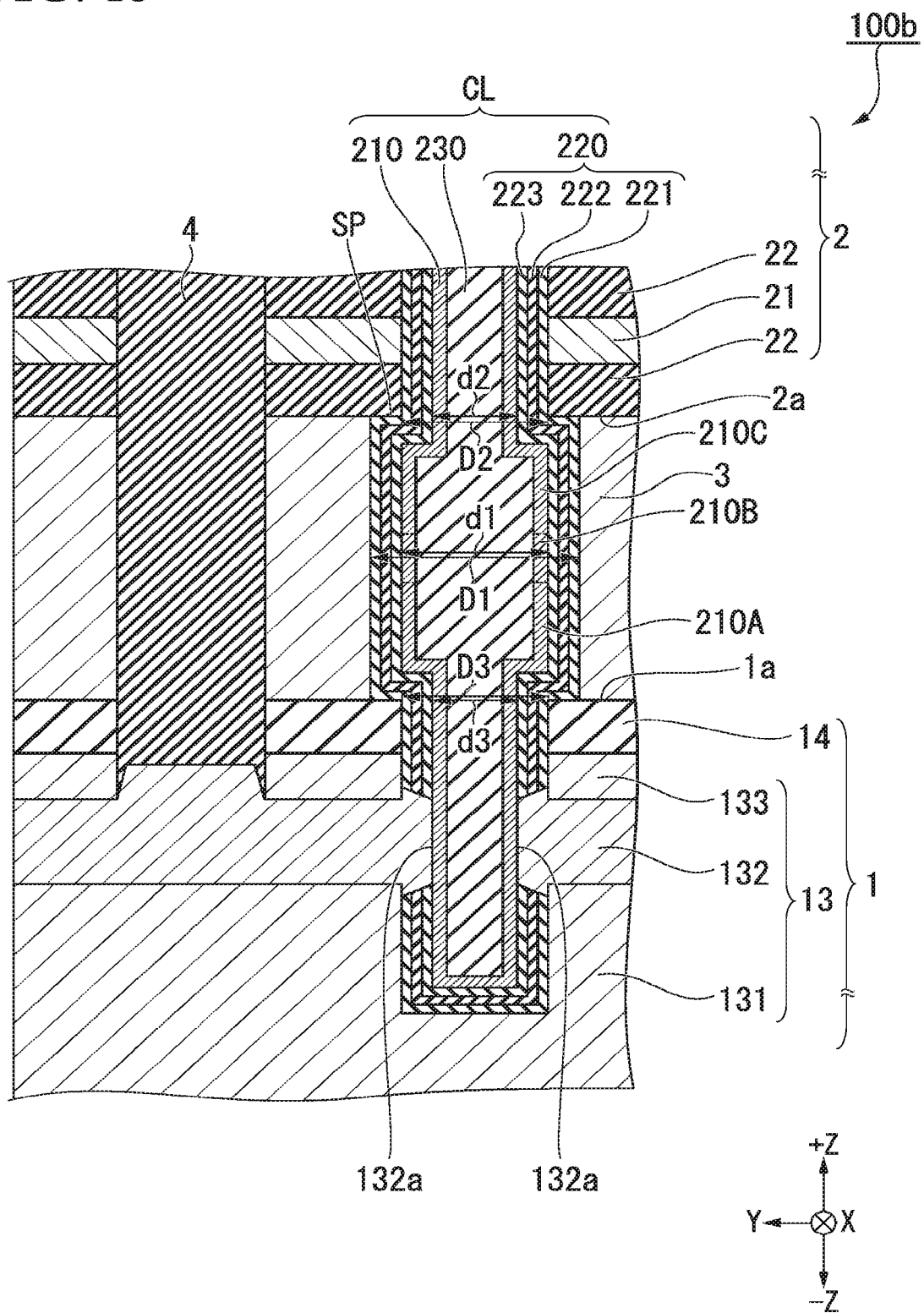
FIG. 15 is an enlarged cross-sectional view of a columnar body, a first semiconductor portion, and a second conductive layer of a semiconductor memory device according to a first modification example of the first embodiment.

FIG. 15 is an enlarged cross-sectional view of a columnar body CL, a first semiconductor portion 13, and a second conductive layer 3 of a semiconductor memory device 100b according to the first modification example of the first embodiment. The semiconductor memory device 100b according to the first modification example is different from the semiconductor memory device 100a shown in FIG. 2 in terms of the structure of the columnar body CL within the second conductive layer 3. The other configurations to be described below are the same as those of the semiconductor memory device 100a according to the first embodiment.

In the present modification example, the outer diameter of the columnar body CL is substantially fixed within the second conductive layer 3. On the other hand, a first outer diameter D1 within the second conductive layer 3 is larger than a second outer diameter D2 on a first surface 2a of a laminated body 2 and a third outer diameter on a second surface 1a of a base portion 1. For this reason, a step SP is formed on the first surface 2a of the laminated body 2 and the second surface 1a of the base portion 1. The outer diameter of the columnar body CL changes discontinuously due to the step SP.

The outer diameter of the semiconductor body 210 also changes discontinuously similar to the outer diameter of the columnar body CL. The outer diameter of the semiconductor body 210 increases in the vicinities of the first surface 2a and the second surface 1a.

With such a configuration, it is possible to achieve an improvement in the speed of an erasure operation, similar to the first embodiment.

According to at least one embodiment described above, the first outer diameter d1 of the semiconductor body 210 is larger than the second outer diameter d2, and thus it is possible to achieve improvements in data erasure operations of the semiconductor memory devices 100a and 100b. The wording that the first outer diameter d1 of the semiconductor body 210 is within the second outer diameter d2 is not the wording of claims but the wording of the embodiment in principle.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing form the spirit of the inventions. The accompanying claims and their equivalents are intended to cover such forms or modifications as would fall within the scope and sprit of the inventions.

What is claimed is:

1. A semiconductor memory device comprising:
   a base portion that includes a first semiconductor portion;
   a laminated body that includes a plurality of first conductive layers and a plurality of insulating layers which are alternately laminated in a first direction;
   a second conductive layer that is positioned between the base portion and the laminated body; and
   a columnar body that is provided throughout an inside of the laminated body and an inside of the base portion and includes a semiconductor body and a charge storage film which is provided between the semiconductor body and one of the plurality of first conductive layer,
   wherein the semiconductor body includes a first region and a second region, the first region extending from a connection portion between the semiconductor body and the first semiconductor portion to an inside of the second conductive layer and including a first material, and the second region being positioned closer to the laminated body than the first region is, being configured such that at least a portion is present at a position facing the second conductive layer, and being configured not to include the first material or having a concentration of the first material which is lower than that in the first region, and
   a first outer circumferential length of the semiconductor body within the second conductive layer is larger than a second outer circumferential length of the semiconductor body on a first surface which is an interface between the second conductive layer and the laminated body.

2. The semiconductor memory device according to claim 1,
   wherein the first outer circumferential length is larger than a third outer circumferential length of the semiconductor body on a second surface which is an interface between the base portion and the second conductive layer.

3. The semiconductor memory device according to claim 1,
   wherein an outer circumferential length of the semiconductor body within the second conductive layer changes continuously in the first direction.

4. The semiconductor memory device according to claim 2,
   wherein the semiconductor body within the second conductive layer has a maximum outer circumferential length in a middle in the first direction, and
   the outer circumferential length of the semiconductor body becomes larger from the second outer circumferential length and the third outer circumferential length toward the maximum outer circumferential length.

5. The semiconductor memory device according to claim 1,
   wherein a third region having a concentration of the first material being equal to or greater than $1 \times 10^{19}$ cm$^{-3}$ and less than $1 \times 10^{20}$ cm$^{-3}$ is provided between the first region and the second region.

6. The semiconductor memory device according to claim 1,
   wherein the semiconductor body within the second conductive layer has a maximum outer circumferential length within a third region disposed between the first region and the second region in the first direction.

7. The semiconductor memory device according to claim 1,
   wherein a first outer circumferential length of the columnar body within the second conductive layer is larger than a second outer circumferential length of the columnar body on the first surface.

8. The semiconductor memory device according to claim 2,
   wherein a first outer circumferential length of the columnar body within the second conductive layer is larger than a third outer circumferential length of the columnar body on the second surface.

9. The semiconductor memory device according to claim 2,
   wherein the columnar body has a step of which an outer circumferential length changes discontinuously on at least one of the first surface and the second surface.

10. The semiconductor memory device according to claim 9,
    wherein an outer circumferential length of the columnar body within the second conductive layer is substantially fixed in the first direction.

11. The semiconductor memory device according to claim 1,
    wherein a concentration of the first material in the connection portion is lower than the concentration of the first material in the second region.

12. The semiconductor memory device according to claim 1,
    wherein an impurity concentration in the first region gradually decreases from the connection portion toward the second region.

13. The semiconductor memory device according to claim 1,
    wherein the semiconductor body including the first material is an n-type semiconductor.

14. The semiconductor memory device according to claim 1,
    wherein the first material includes phosphorus.

15. The semiconductor memory device according to claim 1,
    wherein the semiconductor body includes germanium in addition to the first material.

16. The semiconductor memory device according to claim 1,
    wherein the first semiconductor portion includes a first semiconductor layer, a second semiconductor layer, and a third semiconductor layer in this order from a position far from the laminated body,
    the first semiconductor layer, the second semiconductor layer, and the third semiconductor layer extend in a second direction intersecting the first direction, and
    the second semiconductor layer is connected to the semiconductor body.

17. The semiconductor memory device according to claim 1,
    wherein the base portion includes an insulating film at a position closer to the second conductive layer than the first semiconductor portion.

18. The semiconductor memory device according to claim 1,
    wherein the base portion includes a third conductive layer, an interlayer insulating film, and a substrate in this order from a position close to the first semiconductor portion at a position farther from the second conductive layer than the first semiconductor portion.

19. The semiconductor memory device according to claim 1,
wherein a region located in the same position as the first surface of the semiconductor body includes the second region in the first direction.

20. The semiconductor memory device according to claim 1,
wherein a region located in the same position as the second surface of the semiconductor body includes the first region in the first direction.

* * * * *